US012405624B2

(12) United States Patent
Kazarians et al.

(10) Patent No.: US 12,405,624 B2
(45) Date of Patent: Sep. 2, 2025

(54) LINEAR VOLTAGE REGULATOR AND TEST SYSTEM

(71) Applicant: Medtronic MiniMed, Inc., Northridge, CA (US)

(72) Inventors: Seth N. Kazarians, Duarte, CA (US); Adam S. Trock, Simi Valley, CA (US); Jalal Elidrissi, Santa Clarita, CA (US); Fatemeh Delijani, Chatsworth, CA (US)

(73) Assignee: MEDTRONIC MINIMED, INC., Northridge (CA)

( * ) Notice: Subject to any disclaimer, the term of this patent is extended or adjusted under 35 U.S.C. 154(b) by 0 days.

(21) Appl. No.: 18/600,016

(22) Filed: Mar. 8, 2024

(65) Prior Publication Data

US 2024/0210980 A1   Jun. 27, 2024

Related U.S. Application Data

(63) Continuation of application No. 16/940,669, filed on Jul. 28, 2020, now Pat. No. 11,960,311.

(51) Int. Cl.
   *G05F 1/575*       (2006.01)
   *G01R 1/28*        (2006.01)

(52) U.S. Cl.
   CPC ............... *G05F 1/575* (2013.01); *G01R 1/28* (2013.01)

(58) Field of Classification Search
   CPC .......... G05F 1/462; G05F 1/465; G05F 1/468; G05F 1/56; G05F 1/575; G05F 1/562;
   (Continued)

(56) References Cited

U.S. PATENT DOCUMENTS

| 4,755,173 A | 7/1988 | Konopka et al. |
| 4,786,863 A | 11/1988 | Milkovic |

(Continued)

FOREIGN PATENT DOCUMENTS

| DE | 2610802 A1 | 9/1977 |
| EP | 0759602 B1 | 10/2001 |

(Continued)

OTHER PUBLICATIONS

International Preliminary Report on Patentability dated Feb. 9, 2023 in Application No. PCT/US2021/043210.

(Continued)

*Primary Examiner* — Sean Kayes
*Assistant Examiner* — Nusrat Quddus
(74) *Attorney, Agent, or Firm* — Weaver Austin Villeneuve & Sampson LLP

(57) ABSTRACT

A linear voltage regulator is disclosed. The voltage regulator is configured and controlled such that its output current is substantially equal to the input current. A test system for measuring electrical current consumption of a device under test (DUT) is disclosed. The test system comprises a controller coupled to a power capacitor, a voltage regulator, and a switching circuit. The controller may be configured to: control the switching circuit to place the test system into a charging state to charge the power capacitor with the DC voltage source, at a first time point, control the switching circuit to place the test system into a measurement state such that the power capacitor provides the capacitor voltage to the voltage regulator, and at a second time point after the first time point, calculate electrical current provided by the power capacitor.

20 Claims, 7 Drawing Sheets

(58) Field of Classification Search
CPC .......... G05F 1/565; G05F 1/567; G05F 1/569; G05F 1/571; G05F 1/573; G05F 1/5735; G01R 19/165; G01R 19/16504; G01R 19/16509; G01R 19/16514; G01R 19/16519; G01R 19/16523; G01R 19/16528; G01R 19/16533; G01R 19/16538; G01R 19/16542; G01R 19/16547; G01R 19/16552; G01R 19/16557; G01R 19/16561; G01R 19/16566; G01R 19/16571; G01R 19/16576; G01R 19/1658; G01R 19/16585; G01R 19/1659; G01R 19/16595; G01R 19/17; H02M 3/07; H02M 3/073; H02M 7/10; H02M 7/103; H02M 7/106; H02M 1/088; H02M 2003/071; H02M 2003/072; H02M 2003/075; H02M 2003/076; H02M 2003/077; H02M 2003/078; H02M 2001/007; H02M 2001/0048; H02M 3/1582; H02M 3/1584; H02M 3/285; H02M 3/33561; H02M 7/49; H02M 1/045; H02M 7/006; H02M 7/06; H02M 7/068; H02M 7/153; H02M 7/19; H02M 7/08; H02M 7/17; H02M 7/493; H02M 7/53806; H02M 7/5381; H02M 7/483; H02M 7/217; H02M 7/538466; H02M 7/5387; H02M 7/53871; H02M 7/53873; H02M 7/53875; H02M 1/084; H02M 1/0845; H02J 3/46; H02J 3/38

See application file for complete search history.

(56) References Cited

U.S. PATENT DOCUMENTS

| | | |
|---|---|---|
| 5,391,250 A | 2/1995 | Cheney, II et al. |
| 5,485,408 A | 1/1996 | Blomquist |
| 5,522,803 A | 6/1996 | Teissen-Simony |
| 5,665,065 A | 9/1997 | Colman et al. |
| 5,666,044 A | 9/1997 | Tuozzolo |
| 5,800,420 A | 9/1998 | Gross et al. |
| 5,807,375 A | 9/1998 | Gross et al. |
| 5,886,570 A | 3/1999 | Brokaw |
| 5,925,021 A | 7/1999 | Castellano et al. |
| 5,954,643 A | 9/1999 | Vanantwerp et al. |
| 6,017,328 A | 1/2000 | Fischell et al. |
| 6,186,982 B1 | 2/2001 | Gross et al. |
| 6,246,992 B1 | 6/2001 | Brown |
| 6,248,067 B1 | 6/2001 | Causey, III et al. |
| 6,248,093 B1 | 6/2001 | Moberg |
| 6,300,749 B1 | 10/2001 | Castelli et al. |
| 6,355,021 B1 | 3/2002 | Nielsen et al. |
| 6,379,301 B1 | 4/2002 | Worthington et al. |
| 6,544,212 B2 | 4/2003 | Galley et al. |
| 6,558,351 B1 | 5/2003 | Steil et al. |
| 6,591,876 B2 | 7/2003 | Safabash |
| 6,641,533 B2 | 11/2003 | Causey, III et al. |
| 6,736,797 B1 | 5/2004 | Larsen et al. |
| 6,749,587 B2 | 6/2004 | Flaherty |
| 6,766,183 B2 | 7/2004 | Walsh et al. |
| 6,801,420 B2 | 10/2004 | Talbot et al. |
| 6,804,544 B2 | 10/2004 | Van et al. |
| 7,003,336 B2 | 2/2006 | Holker et al. |
| 7,029,444 B2 | 4/2006 | Shin et al. |
| 7,066,909 B1 | 6/2006 | Peter et al. |
| 7,137,964 B2 | 11/2006 | Flaherty |
| 7,303,549 B2 | 12/2007 | Flaherty et al. |
| 7,399,277 B2 | 7/2008 | Saidara et al. |
| 7,442,186 B2 | 10/2008 | Blomquist |
| 7,602,310 B2 | 10/2009 | Mann et al. |
| 7,647,237 B2 | 1/2010 | Malave et al. |
| 7,699,807 B2 | 4/2010 | Faust et al. |
| 7,727,148 B2 | 6/2010 | Talbot et al. |
| 7,785,313 B2 | 8/2010 | Mastrototaro |
| 7,806,886 B2 | 10/2010 | Kanderian, Jr. et al. |
| 7,819,843 B2 | 10/2010 | Mann et al. |
| 7,828,764 B2 | 11/2010 | Moberg et al. |
| 7,879,010 B2 | 2/2011 | Hunn et al. |
| 7,890,295 B2 | 2/2011 | Shin et al. |
| 7,892,206 B2 | 2/2011 | Moberg et al. |
| 7,892,748 B2 | 2/2011 | Norrild et al. |
| 7,901,394 B2 | 3/2011 | Ireland et al. |
| 7,919,954 B1 | 4/2011 | Mannama et al. |
| 7,942,844 B2 | 5/2011 | Moberg et al. |
| 7,946,985 B2 | 5/2011 | Mastrototaro et al. |
| 7,955,305 B2 | 6/2011 | Moberg et al. |
| 7,963,954 B2 | 6/2011 | Kavazov |
| 7,977,112 B2 | 7/2011 | Burke et al. |
| 7,979,259 B2 | 7/2011 | Brown |
| 7,985,330 B2 | 7/2011 | Wang et al. |
| 8,024,201 B2 | 9/2011 | Brown |
| 8,100,852 B2 | 1/2012 | Moberg et al. |
| 8,114,268 B2 | 2/2012 | Wang et al. |
| 8,114,269 B2 | 2/2012 | Cooper et al. |
| 8,137,314 B2 | 3/2012 | Mounce et al. |
| 8,154,263 B1 | 4/2012 | Shi et al. |
| 8,181,849 B2 | 5/2012 | Bazargan et al. |
| 8,182,462 B2 | 5/2012 | Istoc et al. |
| 8,192,395 B2 | 6/2012 | Estes et al. |
| 8,195,265 B2 | 6/2012 | Goode, Jr. et al. |
| 8,202,250 B2 | 6/2012 | Stutz, Jr. |
| 8,207,859 B2 | 6/2012 | Enegren et al. |
| 8,226,615 B2 | 7/2012 | Bikovsky |
| 8,242,761 B2 | 8/2012 | Napravnik |
| 8,257,259 B2 | 9/2012 | Brauker et al. |
| 8,267,921 B2 | 9/2012 | Yodfat et al. |
| 8,275,437 B2 | 9/2012 | Brauker et al. |
| 8,277,415 B2 | 10/2012 | Mounce et al. |
| 8,292,849 B2 | 10/2012 | Bobroff et al. |
| 8,298,172 B2 | 10/2012 | Nielsen et al. |
| 8,303,572 B2 | 11/2012 | Adair et al. |
| 8,305,580 B2 | 11/2012 | Aasmul |
| 8,308,679 B2 | 11/2012 | Hanson et al. |
| 8,313,433 B2 | 11/2012 | Cohen et al. |
| 8,318,443 B2 | 11/2012 | Norrild et al. |
| 8,323,250 B2 | 12/2012 | Chong et al. |
| 8,343,092 B2 | 1/2013 | Rush et al. |
| 8,352,011 B2 | 1/2013 | Van et al. |
| 8,353,829 B2 | 1/2013 | Say et al. |
| 9,092,041 B1 | 7/2015 | Somerville |
| 9,148,054 B2 | 9/2015 | Chiang et al. |
| 10,185,344 B1 | 1/2019 | Kadanka |
| 10,915,126 B2 | 2/2021 | Sakaguchi et al. |
| 11,650,248 B2 | 5/2023 | Kazarians et al. |
| 11,960,311 B2 | 4/2024 | Kazarians et al. |
| 2002/0196007 A1 | 12/2002 | Descombes |
| 2003/0214275 A1 | 11/2003 | Biagi |
| 2006/0164053 A1 | 7/2006 | Walter et al. |
| 2007/0123819 A1 | 5/2007 | Mernoe et al. |
| 2008/0054867 A1 | 3/2008 | Soude et al. |
| 2008/0157740 A1 | 7/2008 | Gurcan |
| 2008/0174289 A1 | 7/2008 | Gurcan et al. |
| 2010/0156379 A1 | 6/2010 | Marino et al. |
| 2010/0160861 A1 | 6/2010 | Causey, III et al. |
| 2011/0121855 A1* | 5/2011 | Xie ............... G01R 31/40 324/764.01 |
| 2012/0262138 A1 | 10/2012 | Srinivasan et al. |
| 2012/0299564 A1 | 11/2012 | Howes et al. |
| 2013/0285631 A1 | 10/2013 | Bisson et al. |
| 2014/0152279 A1 | 6/2014 | Howes |
| 2014/0218007 A1 | 8/2014 | Vogman |
| 2014/0266104 A1 | 9/2014 | El-Nozahi et al. |
| 2014/0266106 A1 | 9/2014 | El-Nozahi et al. |
| 2014/0312864 A1 | 10/2014 | Patel |
| 2015/0369848 A1 | 12/2015 | Shamir |
| 2016/0124454 A1 | 5/2016 | Chellappa |
| 2016/0187904 A1 | 6/2016 | Merkin et al. |
| 2017/0090493 A1 | 3/2017 | Cui et al. |
| 2018/0239380 A1 | 8/2018 | Ciomaga et al. |
| 2019/0235008 A1* | 8/2019 | Yates ............... G06F 1/26 |

(56) References Cited

U.S. PATENT DOCUMENTS

| | | | |
|---|---|---|---|
| 2019/0384339 A1 | 12/2019 | Pelicia et al. | |
| 2020/0011928 A1* | 1/2020 | Mücke | .................... G05F 1/575 |
| 2020/0241584 A1 | 7/2020 | Kotrc | |
| 2021/0080985 A1 | 3/2021 | Shreepathi Bhat | |
| 2021/0080986 A1 | 3/2021 | Shreepathi Bhat et al. | |
| 2022/0034962 A1 | 2/2022 | Kazarians et al. | |
| 2022/0035392 A1 | 2/2022 | Kazarians et al. | |
| 2022/0045606 A1 | 2/2022 | Lee et al. | |
| 2022/0158535 A1 | 5/2022 | Takobe | |
| 2022/0206521 A1 | 6/2022 | Choi et al. | |
| 2023/0006536 A1 | 1/2023 | Rai et al. | |

FOREIGN PATENT DOCUMENTS

| | | |
|---|---|---|
| GB | 1556896 A | 11/1979 |
| WO | 2022026406 A1 | 2/2022 |
| WO | 2022026408 A1 | 2/2022 |

OTHER PUBLICATIONS

International Preliminary Report on Patentability dated Feb. 9, 2023 in Application No. PCT/US2021/043215.

International Search Report and Written Opinion dated Jan. 7, 2022 in PCT Application No. PCT/US2021/043215.

International Search Report and Written Opinion dated Nov. 16, 2021 in PCT Application No. PCT/US2021/043210.

U.S Advisory Action dated Dec. 29, 2022 in U.S. Appl. No. 16/940,669.

U.S. Final Office Action dated Oct. 3, 2023, in U.S. Appl. No. 16/940,669.

U.S. Final office Action dated Oct. 5, 2022 in U.S. Appl. No. 16/940,669.

U.S. Non-Final Office Action dated Aug. 24, 2022, in U.S. Appl. No. 16/940,664.

U.S. Non-Final Office Action dated Feb. 9, 2023 in U.S. Appl. No. 16/940,669.

U.S. Non-Final Office Action dated Jun. 17, 2022 in U.S. Appl. No. 16/940,669.

U.S. Notice of Allowance dated Dec. 12, 2023 in U.S. Appl. No. 16/940,669.

U.S. Notice of Allowance dated Jan. 27, 2023 in U.S. Appl. No. 16/940,664.

U.S. Notice of Allowance dated Mar. 20, 2023 in U.S. Appl. No. 16/940,664.

* cited by examiner

LINEAR VOLTAGE REGULATOR AND TEST SYSTEM

CROSS-REFERENCE TO RELATED APPLICATIONS

This application is a continuation of U.S. patent application Ser. No. 16/940,669, filed Jul. 28, 2020, titled "LINEAR VOLTAGE REGULATOR WITH ISOLATED SUPPLY CURRENT," the entire contents of which have been herein incorporated by reference for all purposes.

TECHNICAL FIELD

Embodiments of the subject matter described herein relate generally to a test system for measuring electrical current consumed by a device under test, and to a current-isolated voltage regulator suitable for use in the test system.

BACKGROUND

Electronic devices, systems, and components are routinely subjected to electrical tests during manufacturing and/or in an ongoing manner after deployment. For example, an electronic device can be tested to measure the amount of electrical current it consumes during different operating modes. An unusually low or high measured current can be an indicator of a fault, error, or manufacturing defect.

A low power consumption electronic device, such as a battery powered medical device, may utilize a switch-mode power supply (SMPS) that provides an as-needed switching scheme at low load currents that occur during the device's standby mode. In such a device, the switching during standby mode occurs on an as-needed basis. Accordingly, the switching period is often increased to a point where input filter capacitors become ineffective at smoothing the current. This results in a discontinuous input current that typically resembles a pulse train having high dynamic range. In this regard, the non-switching currents between "wake up" current pulses may be four to five orders of magnitude less than the switching pulses. As the switching period increases for a given pulse width (i.e., the duty cycle decreases), the overall current measurement accuracy becomes increasingly affected by the non-switching current. The combination of these factors adversely impact the effectiveness and accuracy of most readily available electrical current measurement systems, which are primarily designed to measure continuous current and/or current having a low dynamic range. As a result, measurement accuracy of discontinuous electrical current with high dynamic range suffers when such devices are tested with conventional (and economically feasible) current measurement equipment.

A test system that measures electrical current may include a voltage regulator to provide operating power to the device under test. A conventional low-dropout or linear voltage regulator utilizes the regulator input voltage to source certain components, such as an internal voltage reference and an error amplifier. Consequently, the input current of this type of voltage regulator will always be higher than the output current. Although this type of voltage regulator is appropriate in some applications, it may not be suitable in certain applications where it is desirable to have the output current match the input current.

BRIEF SUMMARY

Disclosed herein are a linear voltage regulator and a test system for measuring electrical current consumption of a device under test (DUT).

In some embodiments, a linear voltage regulator comprises: an input voltage terminal configured to receive an input current; an output voltage terminal configured to output an output current substantially equal to the input current; a series pass field-effect transistor coupled between the input voltage terminal and the output voltage terminal; a voltage reference source to provide a reference voltage for the linear voltage regulator, the voltage reference source powered by an independent voltage supply that is isolated from the input voltage terminal; a buffer amplifier comprising a positive buffer input coupled to the output voltage terminal, and a negative buffer input coupled to a buffer output, the buffer amplifier powered by the independent voltage supply; and an error amplifier comprising an error output coupled to the series pass field-effect transistor, a positive error input operatively coupled to the output voltage terminal, and a negative error input coupled to the voltage reference source to receive the reference voltage, the error amplifier powered by the independent voltage supply, wherein the output of the error amplifier controls impedance of the series pass field-effect transistor to adjust a regulator output voltage at the output voltage terminal.

In some embodiments, a test system for measuring electrical current consumption of a device under test (DUT) may comprise: a power capacitor configured to provide a capacitor voltage; a voltage regulator comprising a regulator input terminal and a regulator output terminal; a switching circuit to regulate electrical connections between a direct current (DC) voltage source, the power capacitor, and the voltage regulator; and a controller coupled to the power capacitor, the voltage regulator, and the switching circuit. The controller may be configurable to: control the switching circuit to place the test system into a charging state to charge the power capacitor with the DC voltage source; at a first time point, control the switching circuit to place the test system into a measurement state such that the power capacitor provides the capacitor voltage to the voltage regulator; and at a second time point after the first time point, the second time point characterized by a decrease in a voltage of the power capacitor due to loading by the DUT, calculate electrical current provided by the power capacitor in a time period recorded during operation of the test system in the measurement state.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Techniques and technologies may be described herein in terms of functional and/or logical block components, and with reference to symbolic representations of operations, processing tasks, and functions that may be performed by various computing components or devices. Such operations, tasks, and functions are sometimes referred to as being computer-executed, processor-based, software-implemented, computer-implemented, or the like. It should be appreciated that the various block components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

When implemented in software or firmware, various elements of the systems described herein are essentially the code segments or instructions that perform the various tasks. In certain embodiments, the program or code segments are stored in a tangible processor-readable medium, which may include any medium that can store or transfer information. Examples of a non-transitory and processor-readable medium include an electronic circuit, a semiconductor memory device, a ROM, a flash memory, an erasable ROM (EROM), a floppy diskette, a CD-ROM, an optical disk, a hard disk, or the like.

"Node"—As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

Figure 2:
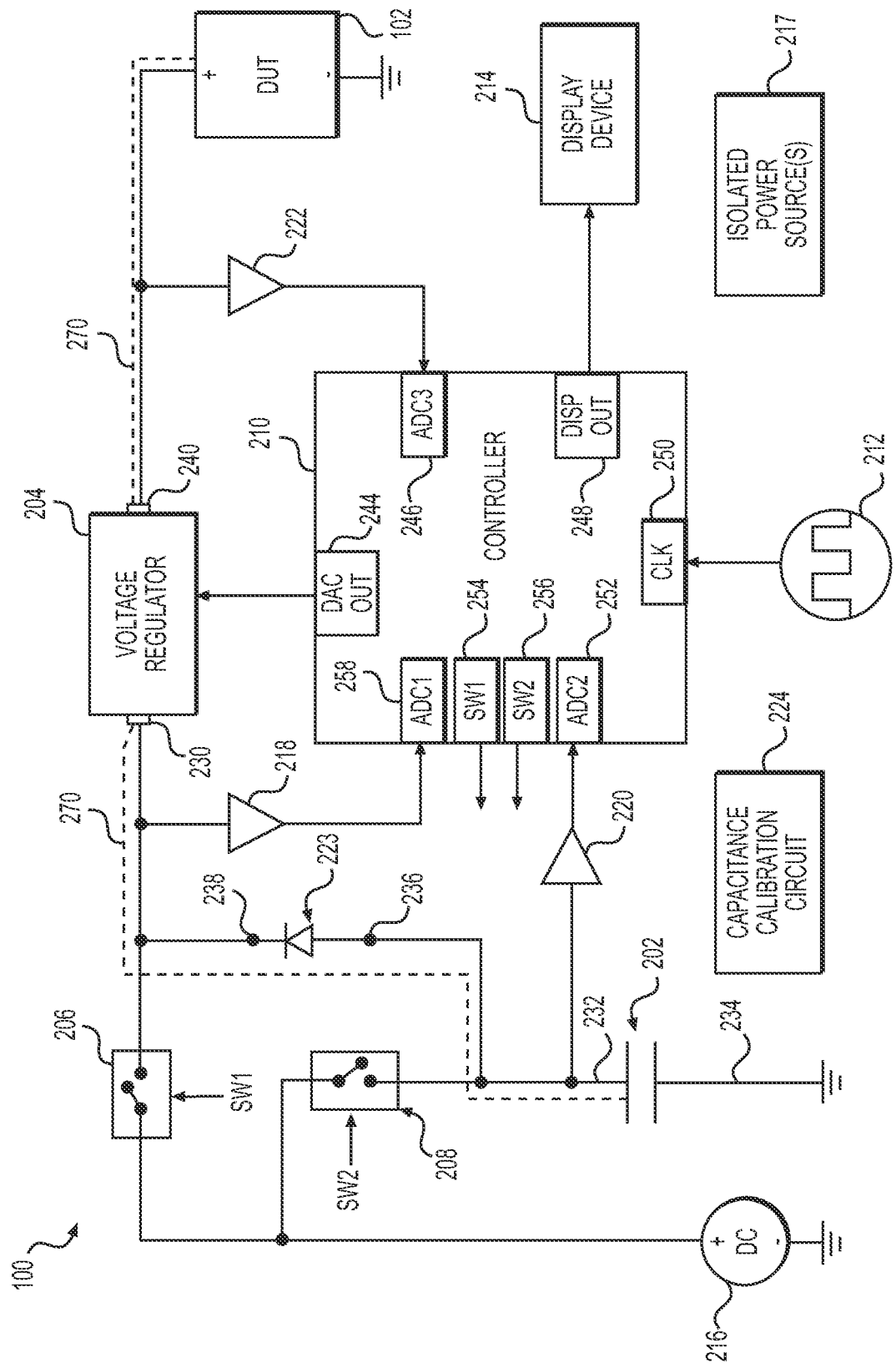
FIG. 2 is a schematic diagram of an embodiment of a test system connected to a device under test.

"Coupled"—The following description may refer to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically. Thus, although the schematic shown in FIG. 2 depicts one exemplary arrangement of elements, additional intervening elements, devices, features, or components may be present in an embodiment of the depicted test system. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

Figure 1:
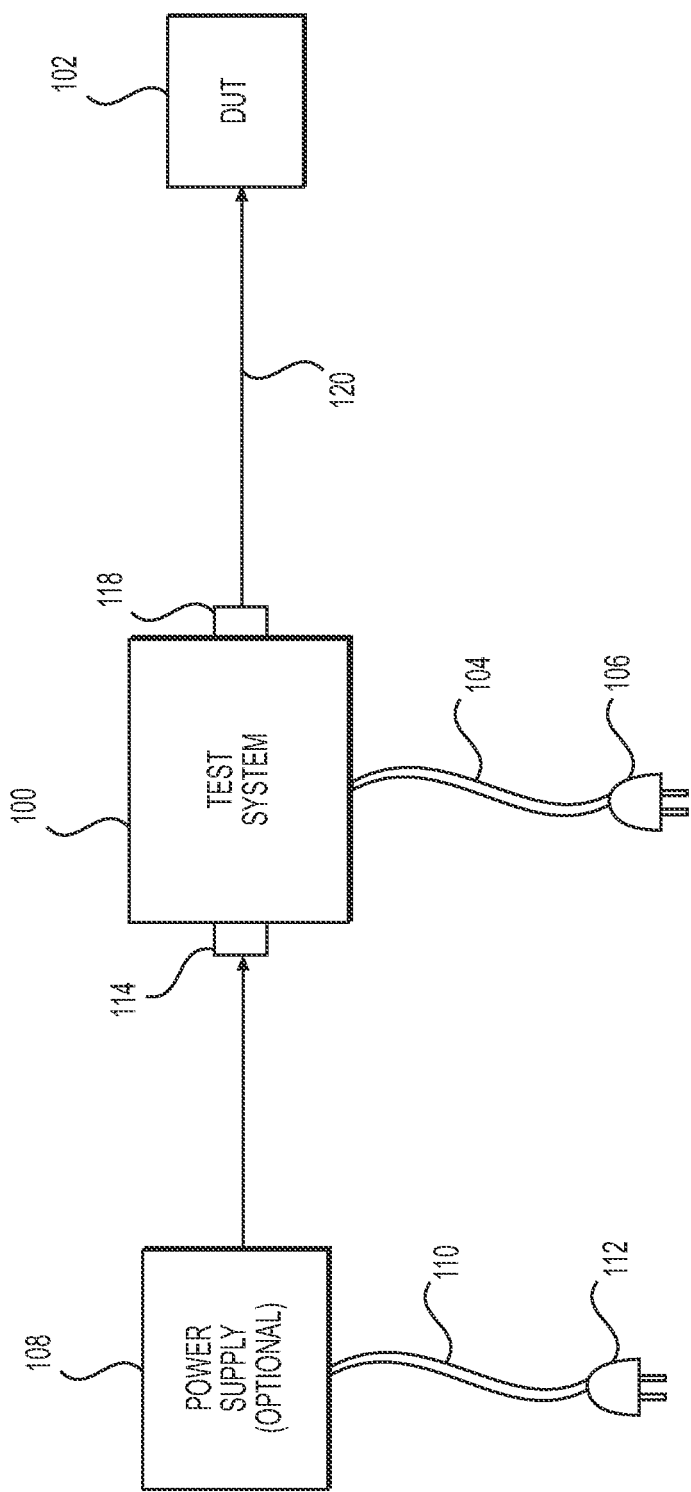
FIG. 1 is a block diagram that depicts an embodiment of a test system in a typical testing environment.

FIG. 1 is a block diagram that depicts an embodiment of a test system 100 in a typical testing environment that includes a device under test (DUT) 102 coupled to the test system 100 in a way that allows the test system 100 to perform one or more electrical tests on the DUT 102. The test system 100 may be implemented as a "bench test" component having a chassis or housing that contains various devices, elements, and electronic components. In certain embodiments, the test system 100 includes a power cord 104 with a standard alternating current (AC) power plug 106 to connect with a mains power source. Alternatively or additionally, the test system 100 can receive direct current (DC) operating voltage from an external power supply 108, which obtains AC voltage from a mains power source via a power cord 110 and AC power plug 112. In such an arrangement, the test system 100 may include at least one input interface 114 to obtain the DC voltage from the external power supply 108 (e.g., cable plug sockets, clip terminals, a connector, or the like).

The test system 100 includes at least one DUT power interface 118 that establishes an electrical connection 120 between a voltage regulator of the test system 100 and the DUT 102. The DUT power interface 118 can be implemented in various form factors, depending on the configuration of the DUT 102, the native power supply of the DUT 102, the manner in which the DUT 102 is to be tested, and the like. For example, the DUT power interface 118 may include or cooperate with any of the following, without limitation: an electrical connector; cable plug sockets, clip terminals, an adapter, or the like. In certain embodiments, the DUT power interface 118 includes or cooperates with a DC voltage cord or cable that terminates with structure that emulates the shape and size of a battery that is normally used as the power source of the DUT 102 (such as a 1.5 volt AA battery). The terminating structure includes electrical contacts that simulate the positive and negative terminals of the DUT's battery, such that the voltage regulator of the test system 100 can provide operating voltage to the DUT 102 during testing.

The DUT 102 can be any electronic device having operating voltage and current specifications that are supported by the test system 100. In this regard, the test system 100 must be able to generate sufficient DC operating voltage and current to power the DUT 102 during testing. In certain applications, the DUT 102 is a portable battery powered medical device, such as a personal insulin infusion device. In certain embodiments, the DUT 102 operates in a low power standby mode that is characterized by a discontinuous and high dynamic range standby current waveform. In accordance with a nonlimiting example, the standby current waveform includes discontinuous pulses that peak at approximately 100 mA and persist for only tens of microseconds, with intervening current of approximately 1.00 µA between the pulses, which may occur every 10-100 milliseconds. As mentioned previously, conventional current meters struggle to accurately measure current having such a high dynamic range.

The test system 100 disclosed here represents an effective, low cost, and elegant solution to the problem outlined above. The test system 100 employs a method of current measurement that is based on the charging and discharging characteristics of a power capacitor having a known, calibrated capacitance. The power capacitor serves as the source of power for the DUT 102, and the charge on the capacitor is directly linked to the current being sourced or sinked, which is defined by physics and the electrical characteristics of the capacitor. The test system 100 uses the power capacitor to measure the total current consumed by the DUT 102 during a measurement time period, independent of the DUT's current waveform type, dynamic range, etc. As explained in more detail below, the test system 100 employs a circuit configuration that is automatically controlled to isolate the current path from the power capacitor to the DUT 102. Any leakage current or quiescent current consumed by components of the test system 100 is negligible relative to the amount of current to be measured, or is isolated such that it has no impact on the current measurement.

FIG. 2 is a schematic diagram that depicts an embodiment of the test system 100 coupled to the DUT 102. For the embodiment of FIG. 2, all of the illustrated items (other than the DUT 102) are part of the test system 100. For the sake of clarity and simplicity, the power cord 104, AC power plug 106, input interface 114, and DUT power interface 118 (see FIG. 1) are not shown in FIG. 2. The illustrated embodiment of the test system 100 includes, without limitation: a power capacitor 202; a voltage regulator 204; a switching circuit having a first switching element 206 and a second switching element 208; a controller 210; a controller clock 212; a display device 214; a DC voltage source 216; one or more isolated power sources 217; a first current-isolating buffer 218; a second current-isolating buffer 220; a third current-isolating buffer 222; a diode 223; a capacitance calibration circuit 224; and various electrically conductive paths, traces, interconnects, or elements that serve to couple the components of the test system 100 together as needed.

The first switching element 206 is coupled between the DC voltage source 216 and a regulator input terminal 230 of the voltage regulator 204. The second switching element 208 is coupled between the DC voltage source 216 and a power terminal 232 of the power capacitor 202 (the power terminal 232 is electrically coupled to the positive conductor or plate of the power capacitor 202, as depicted in FIG. 2). The power capacitor 202 has a ground terminal 234 that is electrically coupled to a ground potential of the test system 100. The diode 223 has an anode 236 coupled to the power terminal 232 of the power capacitor 202, and a cathode 238 coupled to the regulator input terminal 230 of the voltage regulator 204. The voltage regulator 204 has a regulator output terminal 240 that can be coupled to the DUT 102 for testing purposes. In this regard, the DUT 102 can be removably connected to the test system 100 to establish the electrical coupling between the regulator output terminal 240 and the electronics of the DUT 102.

The controller 210 is coupled to at least the power capacitor 202, the voltage regulator 204, the first switching element 206, the second switching element 208, the display device 214, and the controller clock 212. In accordance with the depicted implementation: the controller 210 is coupled to the voltage regulator 204 via an analog output port or terminal 244; the third current-isolating buffer 222 is coupled between the regulator output terminal 240 and the controller 210 via an analog input port or terminal 246; the controller 210 is coupled to the display device via a display output interface 248; the controller 210 is coupled to the controller clock via a clock interface 250; the second current-isolating buffer 220 is coupled between the power terminal 232 of the power capacitor 202 and a second voltage input terminal 252 of the controller 210; the controller 210 is coupled to the first switching element 206 via a first switch control port or terminal 254; the controller 210 is coupled to the second switching element 208 via a second switch control port or terminal 256; and the first current-isolating buffer 218 is coupled between the regulator input terminal 230 and a first voltage input terminal 258 of the controller 210. In FIG. 2, the SW1 and SW2 labels represent switch control signals that are used to control the switching states of the first switching element 206 and the second switching element 208, respectively.

The isolated power source(s) 217 are coupled to certain components, devices, or features of the test system 100 as appropriate to the particular embodiment. For the sake of clarity and simplicity, the various couplings associated with the isolated power source(s) are not depicted in FIG. 2. The capacitance calibration circuit 224 may be realized as a separate circuit module (as depicted in FIG. 2), or it may be implemented with at least some of the other components and features of the test system 100, such as the controller 210, the voltage regulator 204, the diode 223, and corresponding interconnections. For the sake of clarity and simplicity, the various couplings associated with the capacitance calibration circuit are not depicted in FIG. 2.

The DC voltage source 216 provides operating voltage(s) for the test system 100. In certain embodiments, the test system 100 includes the DC voltage source 216, as depicted in FIG. 2. If internal to the test system 100, the DC voltage source 216 can be powered by the mains power source. In some embodiments, however, the DC voltage source 216 may be external to the test system 100. The DC voltage source 216 charges the power capacitor 202 when the second switching element 208 is closed, and provides a DC input voltage to the voltage regulator 204 when the first switching element 206 is closed. The voltage regulator 204 is configured and controlled to generate an appropriate DUT operating voltage at the regulator output terminal 240, based on the DC input voltage that is present at the regulator input terminal 230. Accordingly, the DC voltage source 216 provides a DC voltage that is high enough to charge the power capacitor 202 to its charged voltage level, and high enough to allow the voltage regulator 204 to generate the necessary operating voltage for the DUT 102. In certain nonlimiting embodiments, the nominal operating voltage of the DUT 102 is 1.5 VDC, and the DC voltage source 216 provides 12.0 VDC.

The switching circuit includes at least the first switching element 206 and the second switching element 208. The switching elements 206, 208 may be implemented as solid state (transistor-based) switches, or as electromechanical relays. Ideally, the switching elements 206, 208 consume little to no current. Transistor-based switches are appropriate if the amount of switch leakage current is low enough to be considered negligible, relative to the expected amount of DUT current to be measured. For example, if the measured DUT current is expected to be in the range of about one nanoamp or greater, then switches having leakage current in the picoamp range may be suitable for use in the test system (such that the ratio of measurement current to leakage current is at least 1000:1). Relays typically exhibit little to no leakage current and, therefore, are suitable for use in the test system 100.

For this particular application, the capacitance of the power capacitor 202 should be stable across different working voltages, operating temperatures, environmental conditions, and the like. Accordingly, the type (composition) of the power capacitor 202 should provide a tightly controlled capacitance. For example, the power capacitor 202 may be a polypropylene film type, high voltage capacitor (e.g., generally greater than 100 volts). The capacitance can be selected to suit the needs and requirements of the particular application. For the example mentioned here (where the DC voltage source 216 provides 12 VDC, and the DUT 102 is powered by a 1.5 VDC source), the capacitance of the power capacitor 202 can be a value within the range of about 1.0 mF to about 10.0 mF (for smaller, low power devices). These capacitor sizes are readily available in polypropylene film.

The diode 223 is a passive component that may be a conventional off-the-shelf item. The diode 223 has very low reverse leakage, which should be in the range of about 1,000 times less than the intended measurement current. Accordingly, a silicon diode is best suited for this application (rather than a Schottky diode). The diode 223 does not consume any measurable quiescent current and, therefore, it can appear in the measured current flow path (as depicted in FIG. 2).

The voltage regulator 204 is digitally controlled by the controller 210 such that the current consumed by the voltage regulator 204 is isolated, separated, or otherwise not considered in the measurement of the DUT current. The controller samples the regulator output voltage (at the analog input terminal 246) and generates an appropriate control signal (at the analog output terminal 244) to increase or decrease the regulator output voltage as needed in an ongoing manner. As explained in more detail below, the voltage regulator 204 is sourced by the isolated power source(s) 217 rather than by the DC voltage that appears at the regulator input terminal 230. Consequently, the quiescent current consumed by the voltage regulator 204 is associated with the isolated power source(s) 217, and the voltage regulator 204 operates in a current-isolated manner relative to the current consumed by the DUT 102 during testing. Additional details of the voltage regulator 204 are described below with reference to FIGS. 5-7.

Each of the current-isolating buffers 218, 220, 222 may be implemented as a unity gain operational amplifier having a conventional layout and configuration. Although not shown in FIG. 2, the current-isolating buffers 218, 220, 222 may include or cooperate with a simple voltage divider circuit if needed for compatibility with the analog inputs of the controller 210. The current-isolating buffers 218, 220, 222 allow the controller 210 to sample the respective voltages, without consuming any measurable current. The current-isolating buffers 218, 220, 222 are powered by the isolated power source(s) 217, and they have very low input leakage current. The input leakage current is low enough to make it negligible relative to the amount of DUT current that is to be measured. Thus, the measured DUT current remains accurate and precise even though the current-isolating buffers 218, 220, 222 branch off of the measurement current flow path. Stated another way, the buffers 218, 220, 222 are suitably configured and arranged to isolate the controller 210 from the test current flow path between the power capacitor 202 and the DUT 102.

The test system 100 calculates the electrical current consumed by the DUT 102 during a measurement period of time, and generates the calculated current as an output. The display device 214 represents one type of output device that can be used to display the calculated current as an output. The display device 214 may be integrated with the housing or chassis of the test system 100, or it may be realized as a separate peripheral component that connects to and/or communicates with the test system 100. Any type of display technology and form factor can be utilized with the display device 214, and the specific implementation details of the display device 214 will not be described here. In addition to, or instead of, the display device 214, the test system 100 may include or cooperate with other output devices or systems, such as a printer, an audio transducer, a mechanical output device, or an interface that sends a notification, an email, a text message, an electronic report, or the like.

The controller 210 may be realized as one or more physical devices, such as a microcontroller unit, a field-programmable gate array (FPGA), an application-specific integrated circuit (ASIC), a system on a chip (SOC), or the like. In certain embodiments, the controller 210 is realized as a "single device" microcontroller unit that includes a processor core (e.g., a CPU), a storage medium for processor executable program instructions, an input/output interface, at least one digital-to-analog converter (DAC), at least one analog-to-digital converter (ADC), memory (volatile and nonvolatile), and other peripheral components or elements as needed. The controller 210 may be based on an off-the-shelf component that is programmed, configured, and/or customized for use in the test system 100. To this end, the controller 210 is configurable to carry out the various processes, methods, operations, and functions described herein.

As mentioned previously, the test system 100 is designed, configured, and operated such that the current consumed by the DUT 102 can be accurately and precisely measured in an isolated manner. To this end, leakage current, quiescent current, and/or operating current consumed by certain components, devices, and elements of the test system 100 are minimized to the point where their contribution is negligible, or the sources of such current are isolated from the test current flow path. In this regard, the isolated power source(s) 217 may be utilized to provide operating voltage to one or more of the following items: the first switching element 206; the second switching element 208; the voltage regulator 204; the controller 210; the display device 214; the controller clock 212; the first current-isolating buffer 218; the second current-isolating buffer 220; the third current-isolating buffer 222; and the capacitance calibration circuit 224.

As explained in more detail below, the known capacitance of the power capacitor 202 is used to calculate the current consumed by the DUT 102 during the measurement time period. Although the power capacitor 202 is chosen such that its capacitance is relatively stable and constant, it can still be susceptible to slight variation over time. Thus, it is important to have an accurate calibrated capacitance value. The capacitance calibration circuit 224 is couplable to the power capacitor 202 to calibrate the capacitance of the power capacitor 202. Calibration may occur whenever the test system 100 is powered up, before each current measurement, daily, weekly, or the like. The capacitance calibration circuit 224 can be implemented to self-calibrate the test system 100 using, for example, a constant and known current source, which may cooperate with other components of the test system 100 to perform a calibration routine. When performing a calibration, the fixed current source (e.g., a constant 1.0 mA current) takes the place of the DUT 102. For calibration, the unknown variable is the capacitance, which can be calculated based on the discharge characteristics of the power capacitor 202. The calibrated capacitance can be saved for use as a known value for subsequent current measurements, where the unknown variable is the current consumed by the DUT 102. The test system 100 itself may also be calibrated as needed, such as annually, monthly, or the like. Calibration of the test system 100 may require external calibration equipment to calibrate the voltage sources, the fixed current source that is used to obtain the calibrated capacitance, the ADCs and DACs of the controller 210, etc.

The switching circuit is configured and controlled by the controller 210 to regulate electrical connections between the DC voltage source, the power capacitor 202, and the voltage regulator 204. In this regard, the controller 210 is configurable to control the switching circuit by independently opening and closing the switching elements 206, 208 as needed. The controller 210 activates or actuates the switching elements 206, 208 to place the test system 100 into different states or operating modes including, without limitation: a charging state; a measurement state; and a post-measurement state.

For the charging state, the controller 210 keeps the first and second switching elements 206, 208 closed to charge the power capacitor 202 with source voltage provided by the DC voltage source 216. When both of the switching elements 206, 208 are closed, the diode 223 is not forward biased and, therefore, current does not flow through the diode 223. Thus, the voltage of the power capacitor 202 can be sampled and monitored by the controller 210 via the second voltage input terminal 252. While operating in the charging state, the source voltage of the DC voltage source 216 is present at the regulator input terminal 230, which enables the voltage regulator 204 to generate a regulated DUT operating voltage for the DUT 102. The DUT operating voltage can operate the DUT 102 while the power capacitor 202 is being charged. Accordingly, the DUT 102 can be initialized, prepared for testing, placed into its low current standby mode, or the like, while being sourced by the DC voltage source 216.

For the measurement state, the controller 210 keeps the first and second switching elements 206, 208 open to provide the capacitor voltage to the regulator input terminal 230. Opening the switching elements 206, 208 isolates the DC voltage source 216 from the other components of the test system 100. Thus, while in the measurement state, the power capacitor 202 functions as the voltage source instead of the DC voltage source 216—the power capacitor 202 provides its capacitor voltage to the voltage regulator 204 via the diode 223. When both of the switching elements 206, 208 are open, the diode 223 is forward biased by the capacitor voltage and, therefore, the diode permits discharge of the power capacitor 202 by way of a test current flow path 270. The test current flow path (depicted in dashed lines) runs from the power capacitor 202, through the diode 223, through the voltage regulator 204, and to the DUT 102, which represents the electrical load that consumes the power provided by the power capacitor 202. While operating in the measurement state, the capacitor voltage is present at the regulator input terminal 230, which enables the voltage regulator 204 to generate the regulated DUT operating voltage for the DUT 102 (assuming that the capacitor voltage remains high enough). While operating in the measurement state, the capacitor voltage can be sampled by the controller 210 (via the second voltage input terminal 252), and the voltage present at the regulator input terminal 230 can be sampled by the controller 210 (via the first voltage input terminal 258).

For the post-measurement state, the controller 210 keeps the first switching element 206 closed and the second switching element 208 open. While the test system 100 is in the post-measurement state, the DC voltage source 216 provides its voltage to the regulator input terminal 230 and to the cathode 238 of the diode 223, via the first switching element 206. In the post-measurement state, the diode 223 is reverse biased and, therefore, inhibits further discharge of the power capacitor 202. Accordingly, the source voltage generated by the DC voltage source 216 can be sampled by the controller 210 (via the first voltage input terminal 258), and the discharged voltage of the power capacitor 202 can be sampled by the controller 210 (via the second voltage input terminal 252) when the test system 100 is in the post-measurement state.

Figure 3:
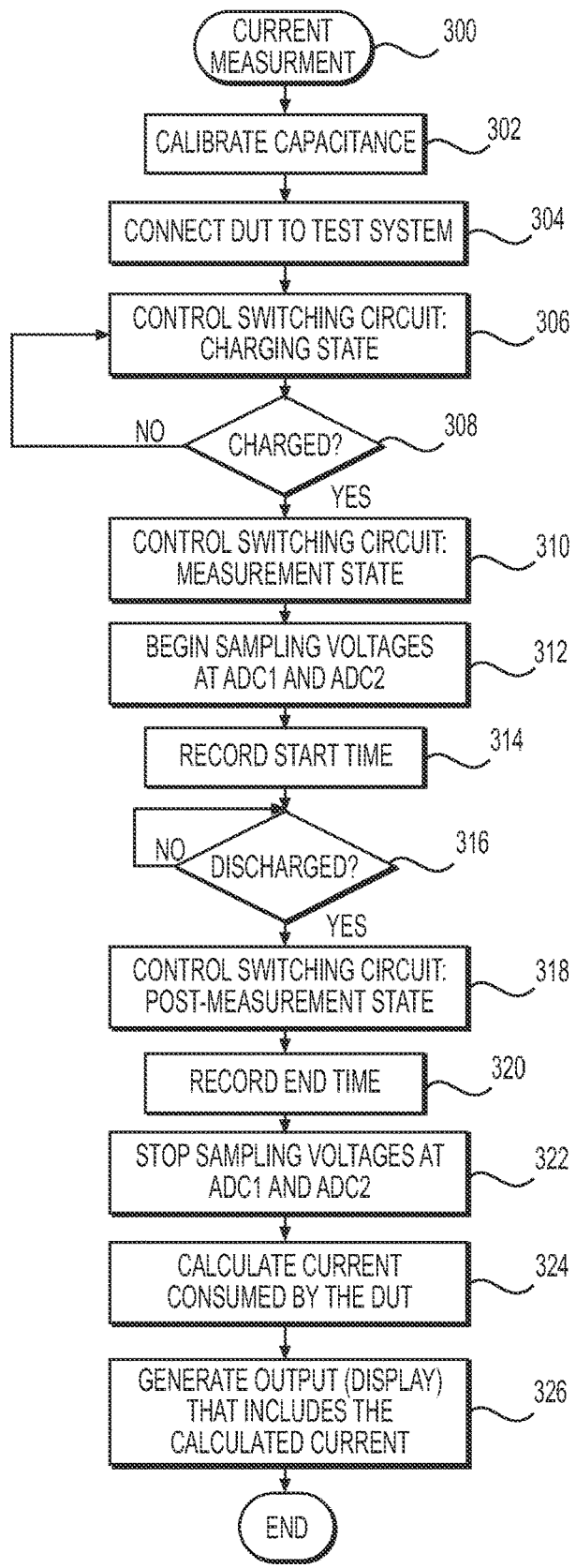
FIG. 3 is a flow chart that illustrates an embodiment of an automated method of measuring electrical current of a device under test.

Operation of the test system 100 will now be described with reference to FIG. 3, which is a flow chart that illustrates an embodiment of an automated current measurement process 300. The process 300 is performed by the test system 100 to measure electrical current consumed by the DUT 102. The description of the process 300 may refer to elements mentioned above in connection with FIGS. 1 and 2. It should be appreciated that the process 300 may include any number of additional or alternative tasks, the tasks shown in FIG. 3 need not be performed in the illustrated order, and the process 300 may be incorporated into a more comprehensive procedure or process having additional functionality not described in detail herein. Moreover, one or more of the tasks shown in FIG. 3 could be omitted from an embodiment of the process 300 as long as the intended overall functionality remains intact.

The process 300 may begin by calibrating the capacitance of the power capacitor 202 (task 302). As explained above, calibration need not be performed for each measurement and, therefore, task 302 may be performed periodically, in accordance with a particular schedule, or the like. Nonetheless, task 302 is shown for the sake of completeness. The following description of the process 300 assumes that the test system 100 has an accurate calibrated value of the capacitance, which can be used to calculate the amount of current consumed by the DUT 102 during the measurement period. The DUT 102 is connected to the test system 100 in an appropriate manner (task 304) to establish an electrical coupling between the regulator output terminal 240 and the electronics of the DUT 102. In this way, the voltage regulator 204 can serve as the power source of the DUT 102.

After the DUT 102 has been connected to the test system 100, the current measurement routine begins. The test may begin automatically in response to connecting the DUT 102, or it may require a user instruction or command. In certain embodiments, the test system 100 automatically controls the switching circuit with the controller 210 to place the test system into the charging state (task 306). As mentioned above, the controller 210 keeps the first and second switching elements 206, 208 closed while the test system 100 is in the charging state, such that the DC voltage source 216 charges the power capacitor 202. Moreover, the DC voltage source 216 provides an input voltage to the voltage regulator 204, which in turn provides an appropriate operating voltage to the DUT 102. Accordingly, the DUT 102 can be initialized and otherwise prepared for the current measurement routine.

The charging state is maintained until the power capacitor 202 is charged (e.g., the capacitor voltage has reached a charged voltage level). If the power capacitor 202 has not reached the charged voltage (the "No" branch of query task 308), then the test system remains in the charging state. If the power capacitor 202 has reached the charged voltage (the "Yes" branch of query task 308), then the process 300 continues by automatically controlling the switching circuit with the controller 210 to transition the test system 100 from the charging state into the measurement state (task 310). In some embodiments, query task 308 involves comparing the capacitor voltage against a charged voltage threshold, such that the switching circuit is automatically controlled to place the test system 100 into the measurement state when the capacitor voltage reaches the charged voltage threshold. The controller 210 can sample the capacitor voltage at the second voltage input terminal 252 for purposes of this comparison. In some embodiments, query task 308 involves monitoring elapsed time after entering the charging state, such that the switching circuit is automatically controlled to place the test system into the measurement state when the elapsed time exceeds a charging time threshold. The controller 210 can maintain a counter or a timer (based on operation of the controller clock 212) to monitor the elapsed time.

This example assumes that the power capacitor 202 has reached its charged voltage and that the test system 100 has transitioned to the measurement state. As mentioned above, the controller 210 opens the first and second switching elements 206, 208 to place the test system 100 into the measurement state, and keeps them open while the test system operates in the measurement state. For the measurement state, the DC voltage source 216 is disconnected from the remaining components, and the power capacitor 202 provides its capacitor voltage to the voltage regulator 204. In response to the transition to the measurement state, the controller 210 begins (or resumes) sampling the voltages at the first voltage input terminal 258 and the second voltage input terminal 252 (task 312), and records a measurement start time (task 314). In certain embodiments, tasks 310, 312, and 314 are performed concurrently such that the measurement start time is recorded, the voltages are sampled, and the switching elements 206, 208 are opened at the same time. Thus, the measurement start time is associated with opening of the switching elements 206, 208.

The measurement state is maintained until the power capacitor 202 has reached a discharged voltage in response to loading, i.e., operation of the DUT 102. In this regard, the capacitor voltage drops over time due to current consumed by the DUT 102. If the power capacitor 202 has not reached the discharged voltage (the "No" branch of query task 316), then the test system 100 remains in the measurement state. If the power capacitor 202 has reached the discharged voltage (the "Yes" branch of query task 316), then the process 300 continues by automatically controlling the switching circuit with the controller 210 to transition the test system 100 from the measurement state into the post-measurement state (task 318). The test system 100 is designed and operated such that the power capacitor 202 is not discharged too much during the measurement state, to ensure that the voltage characteristics of the power capacitor remain linear.

In some embodiments, query task 316 involves comparing the capacitor voltage against a minimum capacitor voltage threshold, such that the switching circuit is automatically controlled to place the test system 100 into the post-measurement state when the capacitor voltage is less than or equal to the minimum capacitor voltage threshold. The controller 210 can sample the capacitor voltage at the second voltage input terminal 252 for purposes of this comparison. For the example presented here, where the DC voltage source 216 provides 12 VDC, the minimum capacitor voltage threshold may be about 8 VDC. In some embodiments, query task 316 involves monitoring elapsed time after entering the measurement state (i.e., after opening of the switching elements 206, 208), such that the switching circuit is automatically controlled to place the test system 100 into the post-measurement state when the elapsed time is greater than or equal to a maximum time threshold. The controller 210 can maintain a counter or a timer (based on operation of the controller clock 212) to monitor this elapsed time. For the example presented here, the maximum time threshold may be on the order of one to two seconds.

This example assumes that the power capacitor 202 has reached the discharged voltage and that the test system 100 has transitioned to the post-measurement state. As mentioned above, the controller 210 closes the first switching element 206 and keeps the second switching element 208 open to place the test system 100 into the post-measurement state, and maintains those switch conditions while the test system 100 operates in the post-measurement state. For the post-measurement state, the DC voltage source 216 is coupled to: the cathode 238 of the diode 223; the input of the first current-isolating buffer 218; and the regulator input terminal 230. The open state of the second switching element 208, however, keeps the DC voltage source 216 disconnected from: the power capacitor 202; the anode 236 of the diode 223; and the input of the second current-isolating buffer 220. Accordingly, the diode 223 is reverse biased, the power capacitor 202 no longer discharges, and the capacitor voltage (which is sampled at the second voltage input terminal 252) remains stable in the post-measurement state. Moreover, the voltage provided by the DC voltage source 216, which corresponds to the charged voltage of the power capacitor 202, can be sampled at the first voltage input terminal 258 in the post-measurement state.

In response to the transition to the post-measurement state, the controller 210 records a measurement end time (task 320). In certain embodiments, tasks 318 and 320 are performed concurrently such that the first switching element 206 is closed and the measurement end time is recorded at the same time. Thus, the measurement end time is associated with closing of the first switching element 206. The controller 210 may stop sampling the voltages at the first voltage input terminal 258 and the second voltage input terminal 252 (task 322) at any suitable time following the transition to the post-measurement state. For reasons explained below, the controller 210 continues sampling these voltages in the post-measurement state for a period of time, to ensure that the voltages have stabilized.

The process 300 continues by calculating the electrical current provided by the power capacitor 202 (and consumed by the DUT 102) in a time period recorded during operation of the test system 100 in the measurement state (task 324). For this example, the time period is defined by the recorded measurement start time and the recorded measurement end time, and the calculation is based on a sampled value of the charged voltage of the power capacitor 202, a sampled value of the discharged voltage of the power capacitor 202, and discharge characteristics of the power capacitor 202—namely, the relationship between capacitance and capacitor voltage over time with respect to electrical current. More specifically, the controller 210 calculates the electrical current consumed by the DUT 102 between the recorded measurement start time and the recorded measurement end time in accordance with the expression $$i = C\frac{V_c - V_d}{t_f - t_i},$$

where: C is the known (calibrated) capacitance of the power capacitor; $V_c$ is the sampled value of the charged voltage; $V_d$ is the sampled value of the discharged voltage; $t_i$ is the recorded measurement start time; and $t_f$ is the recorded measurement end time. The controller 210 records the measurement start and end times, samples the capacitor voltage at the second voltage input terminal 252, and samples the input voltage of the voltage regulator 204 at the first voltage input terminal 258. Thus, the current consumed by the DUT 102 can be easily determined at task 324.

The process 300 continues by generating the calculated electrical current as an output of the test system 100 (task 326). For example, the display device 214 can be controlled and driven in an appropriate manner to display the calculated electrical current in any desired format, e.g., a numerical readout. For this particular example, the test system 100 displays the standby current consumed by the DUT 102 during the measurement time period, which is typically several seconds. The standby current represents an average of the instantaneous current measured over the recorded time period.

Figure 4:
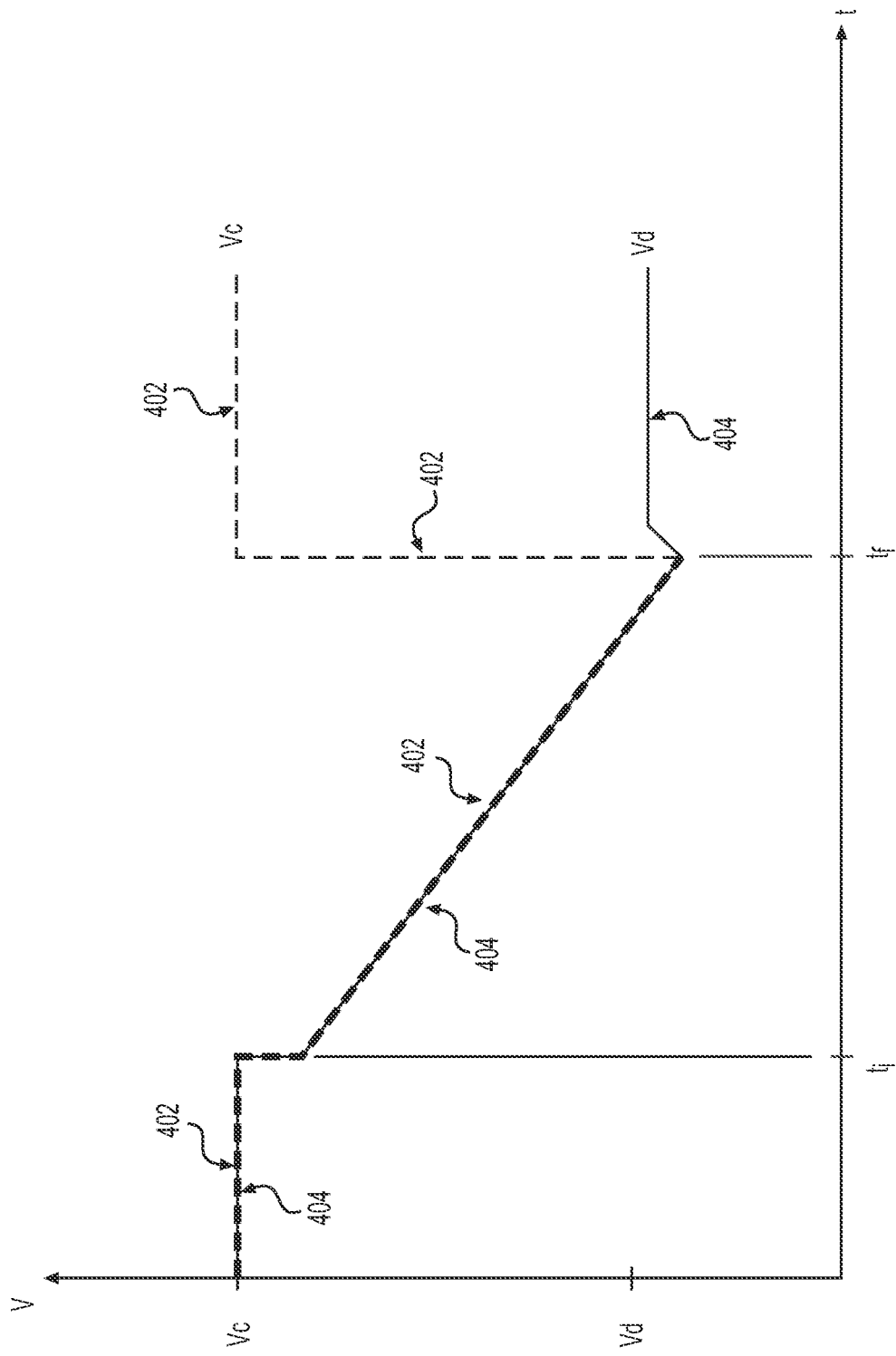
FIG. 4 is a graph that includes plots of voltage levels over time, as sampled during a typical current measurement test performed by the test system shown in FIG. 2.

FIG. 4 is a graph that includes plots of voltage levels over time, as sampled during a typical current measurement test performed by the test system 100 shown in FIG. 2. The horizontal time axis indicates the measurement start time ($t_i$) and the measurement end time ($t_f$). The vertical voltage axis indicates the charged voltage ($V_c$) and the discharged voltage ($V_d$) of the power capacitor 202. In FIG. 4, the dashed line plot 402 corresponds to the voltage present at the regulator input terminal 230, the cathode 238 of the diode 223, and the input of the first current-isolating buffer 218. In other words, the plot 402 represents the voltage sampled at the first voltage input terminal 258 of the controller 210. The solid line plot 404 corresponds to the voltage present at the power terminal 232 of the power capacitor 202, the anode 236 of the diode 223, and the input of the second current-isolating buffer 220. In other words, the plot 404 represents the voltage sampled at the second voltage input terminal 252 of the controller 210. The two plots 402, 404, track each other during the charging state (before the measurement start time) and during the measurement state (between the measurement start time and the measurement end time), due to the status of the switching elements 206, 208 during that period of time. The two plots 402, 404 diverge at the measurement end time, due to the closure of the first switching element 206 (the second switching element 208 remains open). As explained above, the transition from the measurement state to the post-measurement state reconnects the DC voltage source 216 to the voltage regulator 204, which makes the source voltage (i.e., the charged voltage) immediately available for sampling at the first voltage input terminal 258. The capacitor voltage, however, remains stable in the post-measurement state. Accordingly, the discharged voltage of the power capacitor 202 is available for sampling at the second voltage input terminal 252.

For the embodiment shown in FIG. 2, it is assumed that the charged voltage of the power capacitor 202 equals the voltage generated by the DC voltage source 216. Accordingly, the charged voltage value may be sampled at the first voltage input terminal 258 at a sampling time that occurs before the measurement start time and/or at a sampling time that occurs after the measurement end time (i.e., while the test system 100 is in the post-measurement state). Alternatively or additionally, the charged voltage value may be sampled at the second voltage input terminal 252 at a sampling time that occurs before the measurement start time.

The embodiment of the test system 100 shown in FIG. 2 samples the discharged voltage at the second voltage input terminal 252 at a sampling time that occurs after the measurement end time, while the capacitor voltage remains constant. For example, the test system 100 may wait a number of sampling periods or a designated amount of time before sampling the discharged voltage, or it may continue to sample the discharged voltage level but only consider sampled values obtained after the designated amount of time (e.g., 100 ms, one second, or the like). This sampling scheme takes into account the equivalent series resistance (ESR) of the power capacitor 202. The effect of ESR on the sampled voltages is schematically depicted in FIG. 4. At the measurement start time, both plots 402, 404 exhibit a sudden voltage drop. This drop occurs when the switching elements 206, 208 are opened to insert the power capacitor 202 into the current flow path 270; the voltage drop is caused by the ESR of the power capacitor 202. At the measurement end time, however, the power capacitor 202 is removed from the current flow path 270. Consequently, the ESR of the power capacitor 202 results in a quick voltage recovery before the capacitor voltage stabilizes to its discharged voltage level. The controller 210 uses a sampled value of the stabilized capacitor voltage to calculate the current consumed by the DUT 102.

Referring again to task 324 and the expression used to calculate the measured current, the charged voltage ($V_c$) may be sampled: at the first voltage input terminal 258 of the controller 210 at a sampling time that occurs before the measurement start time; at the first voltage input terminal 258 of the controller 210 at a sampling time that occurs after the measurement end time; and/or at the second voltage input terminal 252 of the controller 210 at a sampling time that occurs before the measurement start time. The discharged voltage ($V_d$) is sampled at the second voltage input terminal 252 at a sampling time that occurs after the measurement end time. Although not required, the charged voltage and the discharged voltage can be sampled at the same sampling time (while the test system 100 is in the post-measurement state).

The current measurement procedure described here can reliably and accurately measure the average current consumed by a DUT, even when the current exhibits a very high dynamic range and relatively low peak current values. The test system 100 described here can be fabricated from inexpensive and readily available parts and components, and can be modified as needed to effectively support different types of DUTs having different functional specifications, voltage requirements, and current consumption characteristics.

As mentioned above, the voltage regulator 204 is suitably configured and controlled such that its output current very closely matches its input current (i.e., any quiescent current consumed by the voltage regulator 204 is negligible relative to the amount of DUT current being measured). Linear voltage regulators are used to produce a constant output voltage from a varying input voltage of higher magnitude. Linear voltage regulators typically include a series pass transistor (which may be a MOSFET or a BJT), an error amplifier, a voltage reference, and a feedback divider network. The voltage reference establishes a fixed voltage value that is used for comparison purposes. The feedback divider network produces a scaled version of the output voltage with a reduction ratio equal to the desired output voltage divided by the reference voltage. The error amplifier compares the scaled output voltage against the reference voltage, and drives the series pass transistor to vary its resistance. Ideally, the transistor is driven to minimize the difference between the output voltage and the reference voltage.

A typical linear voltage regulator that follows conventional design methodologies includes three terminals: an input voltage terminal (VIN); an output voltage terminal (VOUT); and a ground terminal (GND). The input voltage is applied between the VIN and GND terminals, and the regulated output voltage is supplied between the VOUT and GND terminals. The series pass transistor places the VIN and VOUT terminals in a series circuit. Theoretically, the current flowing into the VIN terminal ($I_{IN}$) should be equal to the current flowing out of the VOUT terminal ($I_{OUT}$). However, $I_{IN}$ is always higher than $I_{OUT}$ (for such conventional voltage regulators) because the regulator inherently consumes an amount of current that is associated with operation of the voltage reference, the error amplifier, and the feedback divider network. Depending on the topology and implementation of the voltage regulator, the magnitude of the difference between $I_{IN}$ and $I_{OUT}$ is highly variable and may also vary depending on the applied load.

In some applications (e.g., the test system 100 described above), it may be desirable to have $I_{IN}$ match $I_{OUT}$. For example, such a scenario exists when it is necessary to precisely measure the applied load current without affecting the voltage on the VOUT terminal. If the $I_{IN}$ is identical to $I_{OUT}$, then a shunt resistor can be placed in series with the VIN terminal, and the voltage drop across the shunt resistor will be directly proportional to the magnitude of the $I_{OUT}$ current. In this situation, the voltage drop across the shunt resistor will not affect the regulated output voltage of the voltage regulator, because the regulator will naturally account for the drop on the VIN terminal.

Figure 5:
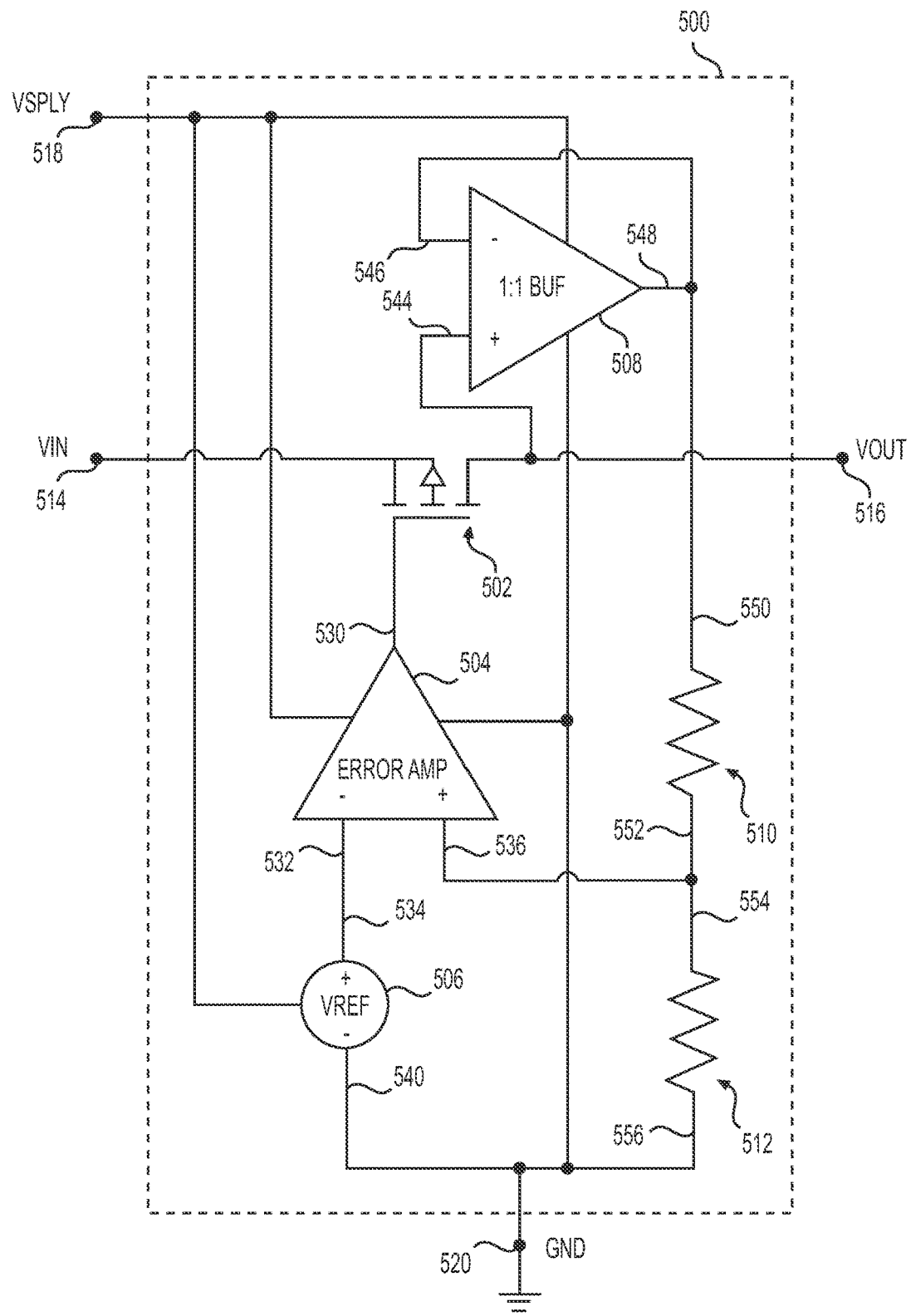
FIGS. 5-7 are schematic diagrams of embodiments of a linear voltage regulator having isolated supply current.
Figure 6:
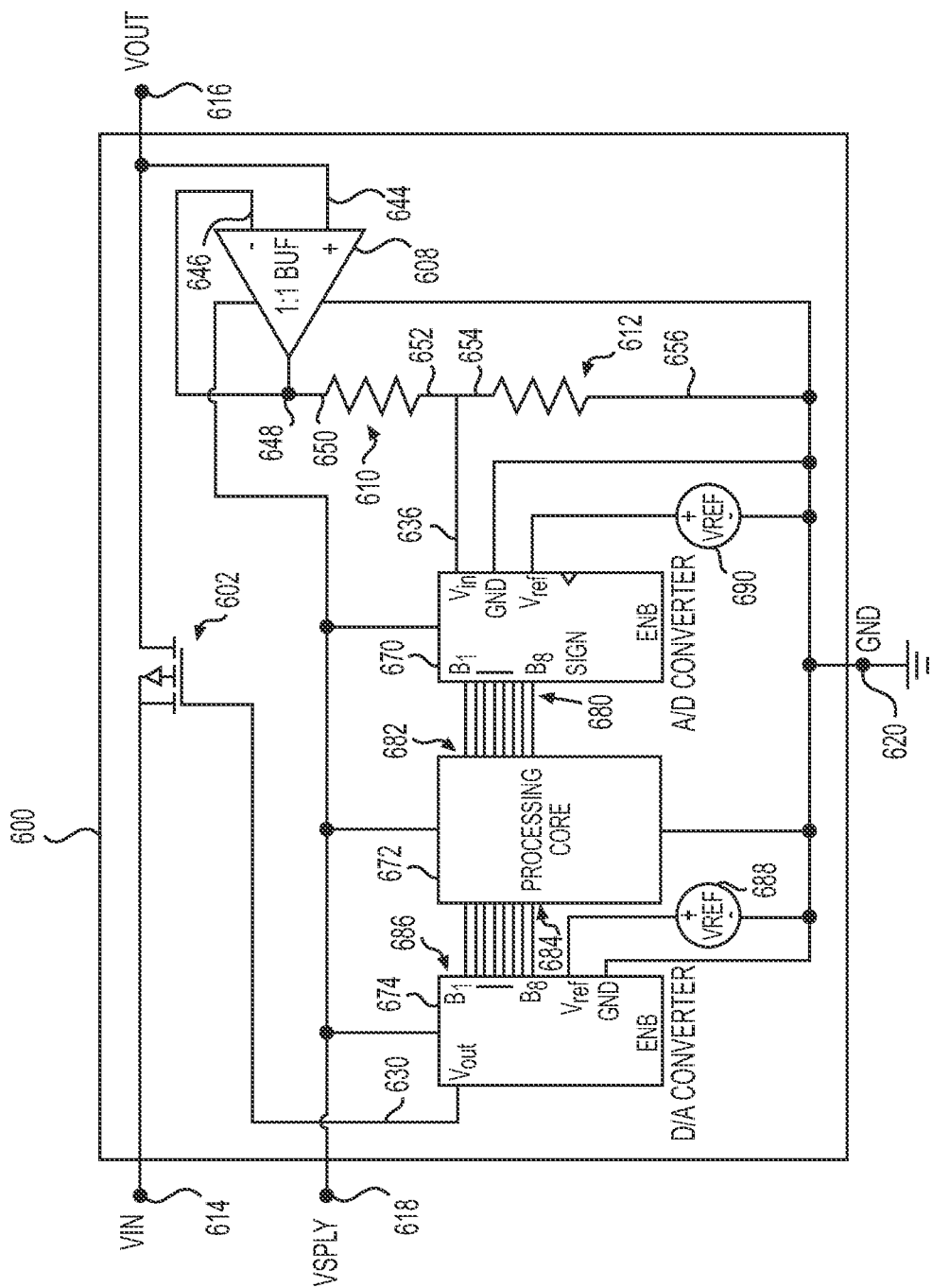
Figure 7:
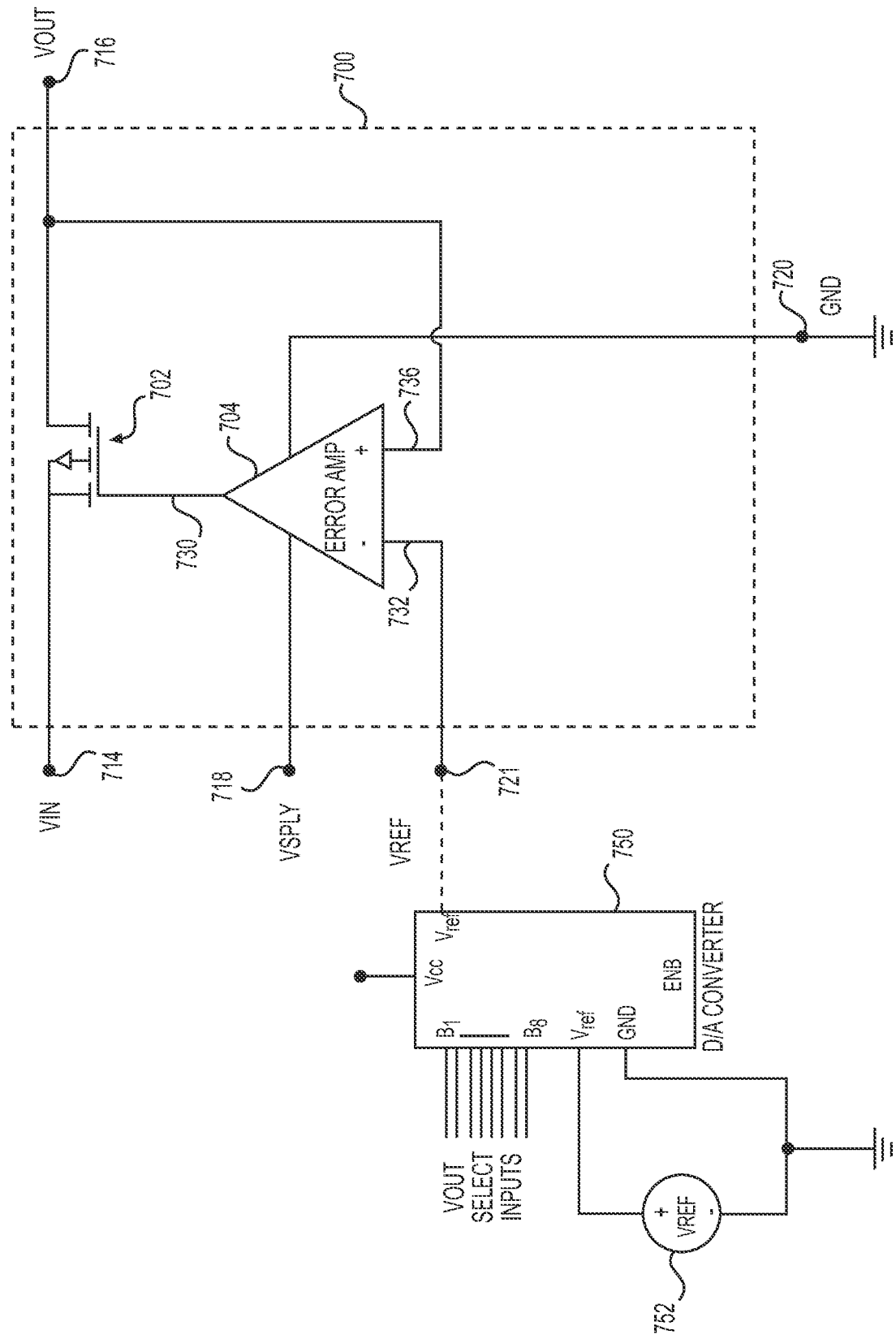

In accordance with certain embodiments described here, the current consumed by the voltage regulator itself is isolated from the current supplied to the load. The current-isolating design and configuration of the voltage regulator results in matching values of $I_{IN}$ and $I_{OUT}$, wherein any difference is negligible or de minimis relative to the magnitude of $I_{IN}$ and $I_{OUT}$. In this regard, FIG. 2 depicts an implementation where the controller 210 controls the voltage regulator 204 without consuming current from the power capacitor 202. Moreover, the voltage regulator 204, the controller 210, and the third current-isolating buffer 222 obtain operating voltage from the isolated power source(s) 217 rather than from the power capacitor 202. FIGS. 5-7 depict embodiments of a linear voltage regulator having isolated supply current. The test system 100 can be modified (if needed) to use the voltage regulators shown in FIGS. 5-7. FIG. 5 depicts a linear voltage regulator 500 that is based on an analog design, FIG. 6 depicts a linear voltage regulator 600 that includes or cooperates with an ADC, a DAC, and a processing core, and FIG. 7 depicts a linear voltage regulator 700 that includes or cooperates with a DAC.

Referring to FIG. 5, the linear voltage regulator 500 generally includes, without limitation: a series pass transistor 502; an error amplifier 504; a voltage reference source 506 to provide a reference voltage for the voltage regulator 500; a buffer amplifier 508; a feedback divider network that includes a first resistor 510 and a second resistor 512; an input voltage terminal 514 (labeled VIN) for the regulator input voltage; an output voltage terminal 516 (labeled VOUT) for the regulator output voltage; a supply voltage terminal 518 (labeled VSPLY); and a ground terminal 520 (labeled GND).

To achieve appropriate current isolation, the series pass transistor 502 is a metal-oxide-semiconductor field-effect transistor (MOSFET). For the depicted embodiment, the transistor 502 is a p-channel enhancement mode MOSFET. The transistor 502 is coupled between the input voltage terminal 514 and the output voltage terminal 516. More specifically, the source of the transistor 502 is coupled to the input voltage terminal 514, the drain of the transistor 502 is coupled to the output voltage terminal 516, and the gate of the transistor is coupled to the error output 530 of the error amplifier 504. The feedback divider network is coupled between the buffer output 548 and the ground terminal 520. A negative error input 532 of the error amplifier 504 is coupled to a positive terminal 534 of the voltage reference source 506, and a positive error input 536 of the error amplifier 504 is coupled to the feedback divider network. More specifically, the positive error input 536 is coupled between the first and second resistors 510, 512, which are connected in series with one another. Notably, the error amplifier 504 is powered by an independent voltage supply, which can be coupled between the supply voltage terminal 518 and the ground terminal 520 (the lines leading from the error amplifier 504 to the supply voltage terminal 518 and the ground terminal 520 represent the supply voltage connection). A negative terminal 540 of voltage reference source 506 is coupled to the ground terminal 520, and the voltage reference source 506 is powered by the independent voltage supply (the voltage reference source 506 is coupled to the supply voltage terminal 518 to obtain the supply voltage).

The buffer amplifier 508 is configured as a unity gain follower having a high input impedance. The positive buffer input 544 of the buffer amplifier 508 is coupled to the drain of the transistor 502 and to the output voltage terminal 516. The negative buffer input 546 of the buffer amplifier 508 is coupled to the buffer output 548 of the buffer amplifier 508 and to a first end 550 of the first resistor 510. Notably, the buffer amplifier 508 is powered by the independent voltage supply (the lines leading from the buffer amplifier 508 to the supply voltage terminal 518 and the ground terminal 520 represent the supply voltage connection). The second end 552 of the first resistor 510 is coupled to a first end 554 of the second resistor 512 and to the positive error input 536 of the error amplifier 504, as mentioned above. The second end 556 of the second resistor 512 is coupled to the ground terminal 520, thus establishing the feedback divider network. The resistor values are chosen such that the feedback divider network provides a scaled output voltage (that ideally matches the reference voltage) at the divider output, which corresponds to the node defined by the second end 552 of the first resistor 510, the first end 554 of the second resistor 512, and the positive error input 536 of the error amplifier 504.

The basic operating principle of the linear voltage regulator 500 is similar to that described above for a traditional three-terminal voltage regulator. In this regard, the output of the error amplifier 504 controls the impedance of the transistor 502 to adjust the regulator output voltage that appears at the output voltage terminal 516. The output of the error amplifier 504 is produced based on the difference between the reference voltage that appears at the negative error input 532 and the scaled output voltage that appears at the positive error input 536. For example, if the scaled output voltage is higher than the reference voltage, then the output voltage of the error amplifier 504 can be adjusted to incrementally increase the series pass resistance of the transistor 502 to reduce the regulator output voltage. Conversely, if the scaled output voltage is lower than the reference voltage, then the output voltage of the error amplifier 504 can be adjusted to incrementally decrease the series pass resistance of the transistor 502 to increase the regulator output voltage.

The voltage regulator 500 achieves supply current isolation by way of the buffer amplifier 508. The buffer amplifier 508 is configured and arranged to operate as a unity gain (1:1) follower, such that the voltage at the buffer output 548 matches the voltage at the positive buffer input 544 (the output of the buffer amplifier 508, rather than the transistor 502, drives the feedback divider network). Current isolation is further achieved through the use of the supply voltage terminal 518 and the ground terminal 520, which are coupled to provide source voltage and operating current to the error amplifier 504, the voltage reference source 506, and the buffer amplifier 508—these components are powered by an independent voltage supply that is coupled to the supply voltage terminal 518, which is isolated from the input voltage terminal 514. Accordingly, the input voltage terminal 514 supplies current only to the output voltage terminal 516, via the transistor 502. The inherently high input impedance of the buffer amplifier 508 results in only a negligible amount of current drawn from the output voltage terminal 516.

The transistor 502 is realized as a MOSFET (either NMOS or PMOS, although FIG. 2 depicts a PMOS implementation) to take advantage of the extremely low gate-source and gate-drain currents. A MOSFET operating in near steady-state conditions has negligible gate-source and gate-drain currents, relative to the amount of series pass current. Furthermore, the high input impedance of the positive buffer input 544 of the buffer amplifier 508 ensures that the current flow into the positive buffer input 544 is negligible compared to the desired current measurement resolution (e.g., less than 1:1000). In this regard, the buffer amplifier 508 isolates the current flow path from the input voltage terminal 514 to the output voltage terminal 516, such that the ratio of current flowing into the positive buffer input 544 to current flowing in the current flow path is less than 1:1000. As an example, if the desired current measurement resolution is 1.0 µA, the input impedance of the buffer amplifier 508 should be on the order of 1.0 GΩ or higher, such that the input current is 1.0 nA or less.

The independent voltage supply (which feeds the supply voltage terminal 518) supplies the quiescent current needed to operate the error amplifier 504, the voltage reference source 506, and the buffer amplifier 508. This arrangement provides additional current isolation because the quiescent current is separate and distinct from the current that flows through the transistor 502.

Referring to FIG. 6, the voltage regulator 600 generally includes, without limitation: a series pass transistor 602; a buffer amplifier 608; a feedback divider network that includes a first resistor 610 and a second resistor 612; an input voltage terminal 614 (labeled VIN); an output voltage terminal 616 (labeled VOUT); a supply voltage terminal 618 (labeled VSPLY); a ground terminal 620 (labeled GND); an ADC 670; a digital processing core 672; and a DAC 674. The arrangement and configuration of the voltage regulator 600 are similar to that described above for the voltage regulator 500. The illustrated embodiment of the voltage regulator 600, however, replaces the error amplifier 504 with the combination of the ADC 670, the processing core 672, and the DAC 674. Accordingly, for the sake of brevity and convenience, common or equivalent aspects of the voltage regulators 500, 600 will not be redundantly described in detail with reference to FIG. 6.

The series pass transistor 602 is realized as a MOSFET having its source coupled to the input voltage terminal 614, its drain coupled to the output voltage terminal 616, and its gate coupled to an analog output 630 of the DAC 674. An analog voltage input 636 of the ADC 670 is coupled to the divider output of the feedback divider network to receive a scaled output voltage produced by the feedback divider network. More specifically, the analog voltage input 636 is coupled between the first and second resistors 610, 612, which are connected in series with one another. The positive buffer input 644 of the buffer amplifier 608 is coupled to the drain of the transistor 602 and to the output voltage terminal 616. The negative buffer input 646 of the buffer amplifier 608 is coupled to the buffer output 648 of the buffer amplifier 608 and to a first end 650 of the first resistor 610. The second end 652 of the first resistor 610 is coupled to a first end 654 of the second resistor 612 and to the analog voltage input 636 of the ADC 670, as mentioned above. The second end 656 of the second resistor 612 is coupled to the ground terminal 620, thus establishing the feedback divider network.

Although depicted as separate blocks in FIG. 6, the ADC 670, the processing core 672, and the DAC 674 can be combined into a single device or component, depending on the desired implementation. For example, the ADC 670, the processing core 672, and the DAC 674 can be realized as features or elements of a microcontroller device. For the illustrated embodiment, the ADC 670 is coupled to the processing core 672 in an appropriate manner to communicate digital information to the processing core 672. Likewise, the processing core 672 is coupled to the DAC 674 in an appropriate manner to communicate digital information to the DAC 674. In this regard, the ADC 670 has a digital output interface 680, which is coupled to a digital input interface 682 of the processing core 672. Moreover, the processing core 672 has a digital output interface 684, which is coupled to a digital input interface 686 of the DAC 674.

The DAC 674 cooperates with a voltage reference source 688, which provides a reference voltage for the digital-to-analog conversion. Similarly, the ADC 670 cooperates with a voltage reference source 690, which provides a reference voltage for the analog-to-digital conversion. The reference voltage used by the DAC 674 will typically be higher than the reference voltage used by the ADC 670. Accordingly, the voltage reference source 688 can be distinct and separate from the voltage reference source 690 (as shown). The ADC 670, the processing core 672, the DAC 674, the buffer amplifier 608, the voltage reference source 688, and the voltage reference source 690 are powered by an independent voltage supply (as described above). Accordingly, these components are coupled to the supply voltage terminal 618 and the ground terminal 620. For simplicity and clarity, FIG. 6 does not show separate connections between the supply voltage terminal 618 and the voltage reference sources 688, 690.

The basic operating principle of the linear voltage regulator 600 is similar to that described above for the voltage regulator 500. The feedback divider network provides the scaled output voltage to the ADC 670. The digital output interface 680 of the ADC 670 provides a digital representation of the scaled output voltage that appears at the analog voltage input 636. The processing core 672 receives the digital representation of the scaled output voltage by way of its digital input interface 682. The processing core 672 implements an algorithm that attempts to minimize the difference between the sampled voltage and a specified reference voltage. In this regard, the processing core 672 calculates a difference between the digital representation of the scaled output voltage and a digital representation of a programmed, stored, or otherwise designated reference voltage. The processing core 672 generates a digital control output at its digital output interface 684, wherein the digital control output is based on the calculated difference. The digital control output is provided to the DAC 674, by way of the digital input interface 686.

The DAC 674 is configured and operated to convert the digital control output into a corresponding analog control voltage, which appears at the analog output 630 of the DAC 674. The analog control voltage controls the impedance of the transistor 602 to adjust the regulator output voltage that appears at the output voltage terminal 616.

As described above with reference to the voltage regulator 500, the transistor 602, the buffer amplifier 608, and the independent voltage supply (that feeds the supply voltage terminal 618) cooperate to provide current isolation for the voltage regulator 600. Accordingly, the input voltage terminal 614 supplies current only to the output voltage terminal 616, via the transistor 602.

Referring to FIG. 7, the voltage regulator 700 generally includes, without limitation: a series pass transistor 702; an error amplifier 704; an input voltage terminal 714 (labeled VIN) for the regulator input voltage; an output voltage terminal 716 (labeled VOUT) for the regulator output voltage; a supply voltage terminal 718 (labeled VSPLY) for an independent voltage supply; a ground terminal 720 (labeled GND); and a reference voltage terminal 721 (labeled VREF) for a reference voltage. Certain aspects of the voltage regulator 700 are similar to that described above for the voltage regulators 500, 600. Accordingly, for the sake of brevity and convenience, common or equivalent aspects of the voltage regulators 500, 600, 700 will not be redundantly described in detail with reference to FIG. 7.

The series pass transistor 702 is realized as a MOSFET having its source coupled to the input voltage terminal 714, its drain coupled to the output voltage terminal 716, and its gate coupled to the error output 730 of the error amplifier 704. A negative error input 732 of the error amplifier 704 is coupled to the reference voltage terminal 721 to receive the reference voltage. In certain embodiments, a positive error input 736 of the error amplifier 704 is directly connected to the drain of the transistor 702 and to the output voltage terminal 716 (in other words, no intervening components, devices, or elements are arranged between the output voltage terminal 716 and the positive error input 736). Thus, the error amplifier 704 directly receives the regulator output voltage in a feedback path. The error amplifier 704 is powered by an independent voltage supply, which can be coupled between the supply voltage terminal 718 and the ground terminal 720. As mentioned previously, the independent voltage supply is isolated from the input voltage terminal 714.

The illustrated embodiment of the voltage regulator 700 employs an external DAC 750 and an associated reference voltage source 752. The DAC 750 and the reference voltage source 752 take the place of an internal voltage reference for the error amplifier 704, a feedback divider network, and a 1:1 buffer amplifier (which are described above in the context of the voltage regulators 500, 600). The DAC 750 and the reference voltage source 752 obtain operating power from a source other than the voltage that serves as the input to the voltage regulator 700. For example, the DAC 750 and the reference voltage source 752 may be powered by the independent voltage supply and/or by another auxiliary voltage supply (not shown in FIG. 7).

The DAC 750 generates a fixed analog voltage that is equal to the desired regulator output voltage. The error amplifier 704 compares the voltage at the output voltage terminal 716 against the voltage applied to the reference voltage terminal 721, and drives the series pass transistor 702 to maintain the minimum possible difference. The positive error input 736 of the error amplifier 704 has a very high impedance (as mentioned above with reference to the buffer amplifier 508) to limit the amount of current drawn from the output voltage terminal 716 by the error amplifier 704.

The DAC 750 functions as a fixed reference voltage source, and its analog output is coupled to the reference voltage terminal 721. The DAC 750 represents a digitally programmable component that can be configured to provide the desired reference voltage, up to a maximum voltage that is based on the voltage generated by the reference voltage source 752. Thus, the reference voltage provided by the DAC 750 can be digitally programmed and adjusted to match the expected regulator output voltage present at the output voltage terminal 716. In alternative implementations, a suitably configured analog voltage source or fixed voltage supply can be utilized instead of the DAC 750. For example, if the regulator output voltage is expected to be 1.5 VDC, then an external 1.5 VDC voltage source can be coupled to the reference voltage terminal 721.

The basic operating principle of the linear voltage regulator 700 is similar to that described above for the voltage regulator 500. The regulator output voltage (not a scaled version of it) is fed directly to the positive error input 736 of the error amplifier 704, and the external DAC 750 provides the desired reference voltage to negative error input 732 of the error amplifier 704, by way of the reference voltage terminal 721. The error amplifier 704 generates its output based on the difference between the reference voltage and the regulator output voltage, and the output controls the impedance of the transistor to adjust the regulator output voltage as needed.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

The invention claimed is:

1. A linear voltage regulator comprising:
an input voltage terminal configured to receive an input current;
an output voltage terminal configured to output an output current substantially equal to the input current;
a series pass field-effect transistor coupled between the input voltage terminal and the output voltage terminal;
a voltage reference source to provide a reference voltage for the linear voltage regulator, the voltage reference source powered by an independent voltage supply that is isolated from the input voltage terminal;
a buffer amplifier comprising a positive buffer input coupled to the output voltage terminal, and a negative buffer input coupled to a buffer output, the buffer amplifier powered by the independent voltage supply; and
an error amplifier comprising an error output coupled to the series pass field-effect transistor, a positive error input operatively coupled to the output voltage terminal, and a negative error input coupled to the voltage reference source to receive the reference voltage, the error amplifier powered by the independent voltage supply, wherein the output of the error amplifier controls impedance of the series pass field-effect transistor to adjust a regulator output voltage at the output voltage terminal.

2. The linear voltage regulator of claim 1, further comprising a supply voltage terminal for the independent voltage supply, wherein:
the buffer amplifier is coupled to the supply voltage terminal and to a ground terminal;
the error amplifier is coupled to the supply voltage terminal and to the ground terminal; and
the voltage reference source is coupled to the supply voltage terminal and to the ground terminal.

3. The linear voltage regulator of claim 1, wherein the series pass field-effect transistor is a metal-oxide-semiconductor field-effect transistor (MOSFET).

4. The linear voltage regulator of claim 3, wherein:
the MOSFET has a source, a drain, and a gate;
the source of the MOSFET is coupled to the input voltage terminal;
the drain of the MOSFET is coupled to the output voltage terminal; and
the gate of the MOSFET is coupled to the error output of the error amplifier.

5. The linear voltage regulator of claim 1, wherein the buffer amplifier is configured as a unity gain follower.

6. The linear voltage regulator of claim 1, wherein high input impedance of the positive buffer input isolates a current flow path from the input voltage terminal to the output voltage terminal, such that a ratio of current flowing into the positive buffer input to current flowing in the current flow path is less than 1:1000.

7. The linear voltage regulator of claim 1, further comprising a feedback divider network coupled between the buffer output and a ground terminal.

8. The linear voltage regulator of claim 7, wherein the positive error input is operatively coupled to the output voltage terminal via an output of the feedback divider network.

9. The linear voltage regulator of claim 7, wherein the feedback divider network comprises:
a first resistor coupled between the buffer output of the buffer amplifier and the divider output; and
a second resistor coupled between the divider output and the ground terminal.

10. The linear voltage regulator of claim 1, wherein the buffer amplifier comprises an input node configured to receive an input current at least two orders of magnitude less than a magnitude of the output current at the output voltage terminal.

11. A test system for measuring electrical current consumption of a device under test (DUT), the test system comprising:
a power capacitor configured to provide a capacitor voltage;
a voltage regulator comprising a regulator input terminal and a regulator output terminal;
a switching circuit to regulate electrical connections between a direct current (DC) voltage source, the power capacitor, and the voltage regulator; and
a controller coupled to the power capacitor, the voltage regulator, and the switching circuit, the controller configurable to:
control the switching circuit to place the test system into a charging state to charge the power capacitor with the DC voltage source;
at a first time point, control the switching circuit to place the test system into a measurement state such that the power capacitor provides the capacitor voltage to the voltage regulator;
detect, at a second time point after the first time point, by the controller sampling a voltage of the power capacitor and comparing the sampled voltage to a threshold, that loading by the DUT has caused the voltage of the power capacitor to drop below a threshold; and
responsive to detecting that loading by the DUT has caused the voltage of the power capacitor to drop below the threshold, calculate electrical current provided by the power capacitor in a time period recorded during operation of the test system in the measurement state.

12. The test system of claim 11, further comprising a display device coupled to the controller, the display device controlled to display the calculated electrical current.

13. The test system of claim 11, the switching circuit comprising:
a first switching element coupled between the DC voltage source and the regulator input terminal; and
a second switching element coupled between the DC voltage source and a power terminal of the power capacitor, wherein:
the controller keeps the first and second switching elements closed for the charging state to charge the power capacitor with source voltage provided by the DC voltage source, and to generate the DUT operating voltage from the source voltage; and
the controller keeps the first and second switching elements open for the measurement state to provide the capacitor voltage to the regulator input terminal.

14. The test system of claim 13, wherein the controller is configurable to:
record a measurement start time associated with opening of the first switching element when the second switching element is open, wherein the opening of the first switching element transitions the test system from the charging state to the measurement state if the second switching element is open; and
record a measurement end time associated with closing of the first switching element when the second switching element is open, wherein the closing of the first switching element transitions the test system from the measurement state to a post-measurement state if the second switching element is open;
wherein the time period is defined by the measurement start time and the measurement end time as recorded.

15. The test system of claim 11, wherein the electrical current is calculated based on a difference between a sampled value of a charged voltage of the power capacitor and a sampled value of a discharged voltage of the power capacitor.

16. The test system of claim 13, further comprising a diode having an anode coupled to the power terminal of the power capacitor, and having a cathode coupled to the regulator input terminal, the diode permitting discharge of the power capacitor when the first and second switching elements are open, and the diode inhibiting discharge of the power capacitor when the first switching element is closed and the second switching element is open.

17. The test system of claim 11, further comprising a calibration circuit couplable to the power capacitor to calibrate the capacitance of the power capacitor.

18. The test system of claim 11, further comprising:
a first current-isolating buffer, coupled between the regulator input terminal and a first voltage input terminal of the controller, to isolate the controller from a test current flow path between the power capacitor and the DUT; and a second current-isolating buffer, coupled between a power terminal of the power capacitor and a second voltage input terminal of the controller, to isolate the controller from the test current flow path.

19. The test system of claim 11, wherein the second time point corresponds to a time at which the power capacitor has reached a discharged voltage.

20. The test system of claim 11, wherein the first time point corresponds to a time at which the power capacitor has reached a charged voltage.

\* \* \* \* \*